United States Patent
Chiu et al.

(10) Patent No.: US 6,586,322 B1
(45) Date of Patent: Jul. 1, 2003

(54) METHOD OF MAKING A BUMP ON A SUBSTRATE USING MULTIPLE PHOTORESIST LAYERS

(75) Inventors: Chih-Cheng Chiu, Shinjuang (TW); Sheng-Liang Pan, Hsin-Chu (TW); Kuo-Liang Lu, Hsin-Chu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 10/032,341

(22) Filed: Dec. 21, 2001

(51) Int. Cl.⁷ .................................................. H01L 21/44
(52) U.S. Cl. .................... 438/612; 438/613; 438/614; 438/615
(58) Field of Search ................................ 438/612–617; 430/156, 257, 313, 312, 316

(56) References Cited

U.S. PATENT DOCUMENTS

| | | | |
|---|---|---|---|
| 3,930,865 A | * | 1/1976 | Faust et al. |
| 5,492,235 A | * | 2/1996 | Crafts et al. |
| 5,496,770 A | * | 3/1996 | Park |
| 6,426,281 B1 | * | 7/2002 | Lin et al. |

* cited by examiner

Primary Examiner—Ha Tran Nguyen
(74) Attorney, Agent, or Firm—Tung & Associates

(57) ABSTRACT

A method of forming a bump on a substrate such as a semiconductor wafer or flip chip. The method includes the step of providing a semiconductor device having a contact pad and an upper passivation layer and an opening formed in the upper passivation layer exposing a portion of the contact pad. An under bump metallurgy is deposited over the upper passivation layer and the contact pad. A first photoresist layer is deposited in a liquid state so that the first photoresist layer covers the under bump metallurgy. A second photoresist layer is deposited and the second photoresist layer is a dry film photoresist. The unexposed portions of the first photoresist layer are removed. The remaining portions of the first photoresist layers are removed. The electrically conductive material is reflown to provide a bump on the semiconductor device.

16 Claims, 5 Drawing Sheets

METHOD OF MAKING A BUMP ON A SUBSTRATE USING MULTIPLE PHOTORESIST LAYERS

FIELD OF THE INVENTION

This invention relates to a method of making a bump on a substrate, and more particularly, to a method of making a bump on a substrate using multiple photoresist layers.

BACKGROUND OF THE INVENTION

A flip chip microelectronic assembly includes a direct electrical connection of face down (that is, "flipped") electronic components onto substrates, such as ceramic substrates, circuit boards, or carriers using conductive bump bond pads of the chip. Flip chip technology is quickly replacing older wire bonding technology that uses face up chips with a wire connected to each pad on the chip.

The flip chip components used in flip chip microelectronic assemblies are predominantly semiconductor devices, however, components such as passive filters, detector arrays, and MEM devices are also being used in flip chip form. Flip chips are also known as "direct chip attach" because the chip is directly attached to the substrate, board, or carrier by the conductive bumps.

The use a flip chip packaging has dramatically grown as a result of the flip chip's advantages in size, performance, flexibility, reliability, and cost over other packaging methods and from the widening availability of flip chip materials, equipment and services. In some cases, the elimination of old technology packages and bond wires may reduce the substrate or board area needed to secure the device by up to 25 percent, and may require far less height. Further, the weight of the flip chip can be less than 5 percent of the old technology package devices.

Flip chips are advantageous because of their high-speed electrical performance when compared to other assembly methods. Eliminating bond wires reduces the delay in inductance and capacitance of the connection, and substantially shortens the current path resulting in a high speed off-chip interconnection.

Flip chips also provide the greatest input/output connection flexibility. Wire bond connections are generally limited to the perimeter of the chip or die, driving the die sizes up as a number of connections have increased over the years. Flip chip connections can use the whole area of the die, accommodating many more connections on a smaller die. Further, flip chips can be stacked in 3-D geometries over other flip chips or other components.

Flip chips also provided the most rugged mechanical interconnection. Flip chips when underfilled with an adhesive such as an epoxy, can withstand the most rugged durability testing. In addition to providing the most rugged mechanical interconnection, flip chips can be the lowest cost interconnection for high-volume automated production.

The bumps of the flip chip assembly serve several functions. The bumps provided an electrical conductive path from the chip (or die) to the substrate on which the chip is mounted. A thermally conductive path is also provided by the bumps to carry heat from the chip to the substrate. The bumps also provided part of the mechanical mounting of the chip to the substrate. A spacer is provided by the bumps that prevents electrical contact between the chip and the substrate connectors. Finally, the bumps act as a short lead to relieve mechanical strain between the chip and the substrate.

Flip chips are typically made by a process including placing solder bumps on a silicon wafer. The solder bump flip chip processing typically includes four sequential steps: 1) preparing the wafer for solder bumping; 2) forming or placing the solder bumps on the wafer; 3) attaching the solder bumped die to a board, substrate or carrier; and 4) completing the assembly with an adhesive underfill. A brief description of the prior art methods of performing the first step will provide a better background for understanding the present invention.

The first step in a typical solder bumping process involves preparing the semiconductor wafer burping sites on bond pads of the individual integrated circuits defined in the semiconductor wafer. The preparation may include cleaning, removing insulating oxides, and preparing a pad metallurgy that will protect the integrated circuits while making good mechanical and electrical contact with the solder bump. Accordingly, protective metallurgy layers may be provided over the bond pad. Ball limiting metallurgy (BLM) or under bump metallurgy (UBM) generally consists of successive layers of metal. The "adhesion" layer must adhere well to both the bond pad metal and the surrounding passivation, provide a strong, lowstress mechanical and electrical connection. The "diffusion barrier" layer prevents the diffusion of solder into the underlying material. The "solder wettable" layer provides a wettable surface for the molten solder during the solder bumping process, for good bonding of the solder to the underlying metal.

In fabrication a flip-chip bond structure, the fabrication process requires a tight control of interface processes and manufacturing parameters in order to meet very small dimensional tolerances. Various techniques may be utilized to fabricate a UBM structure and to deposit the solder bump. A few widely used methods of depositing bumps include evaporation, electroplating, electroless plating and screen-printing. Kung et al, U.S. Pat. No. 6,179,200 provides a description of these more widely used methods of depositing bumps as follows.

The formation of solder bumps can be carried out by an evaporation method of Pb and Sn through a mask for producing the desired solder bumps. When a metal mask is used, UBM metals and solder materials can be evaporated through designated openings in the metal mask and be deposited as an array of pads onto the chip surface.

In one prior art evaporation method, a wafer is first passivated with an insulating layer, via holes are then etched through the wafer passivation layer which is normally $SiO_2$ to provide a communication path between the chip and the outside circuit. After a molybdenum mask is aligned on the wafer, a direct current sputtering cleans the via openings formed in the passivation layer and removes undesirable oxides. A cleaned via opening assures low contact resistance and good adhesion to the $SiO_2$. A chromium layer is evaporated through a metal mask to form an array of round metal pads each covering an individual via to provide adhesion to the passivation layer and to form a solder reaction barrier to the aluminum pad underneath. A second layer of chromium/copper is then co-evaporated to provide resistance to multiple reflows. This is followed by a final UBM layer of pure copper which forms the solderable metallurgy. A thin layer of gold may optionally be evaporated to provide an oxidation protection layer. These metal-layered pads define the solder wettable regions on the chips, which are commonly referred to as the ball limiting metallurgy (BLM) or under bump metallurgy (UBM). After the completion of UBM, solder evaporation occurs through a metal mask, which has a hole diameter slightly greater than the UBM mask-hole diameter. This provides the necessary volume for forming a subsequent solder ball. A solder reflow process is performed at a temperature of about 350 degrees Celsius to melt and homogenize the evaporated metal pad and to impart a truncated spherical shape to the solder bump. The evaporation method, even though well established and has been practiced for a long time in the industry, is a slow process and thus can not be run at a high throughput rate.

A second method for forming solder bumps is the electroplating method. In an electroplating process, UBM layers are first deposited, followed by the deposition of a photoresist layer, the patterning of the photoresist layer, and then the electro-deposition of a solder material into the photoresist openings. After the electro-deposition process is completed, the photoresist layer can be removed and the UBM layers can be etched by using the plated solder bumps as a mask. The solder bumps are then reflown in a furnace reflow process. The photolithography/electroplating technique is a simpler technique than evaporation and is less expensive because only a single masking operation is required. However, electroplating requires the deposition of a thick and uniform solder over the entire wafer area and etching metal layers on the wafer without damaging the plated solder layer. The technique of electroless plating may also be used to form the UBM structure.

Another solder bump formation technique that is capable of solder-bumping a variety of substrates is a solder paste screening method. The screen printing technique can be used to cover the entire area of an 8-inch wafer. In this method, a wafer surface covered by a passivation layer with bond pads exposed is first provided. UBM layers are then deposited on top of the bond pads and the passivation layer. After the coating of a photoresist layer and the patterning of the layer, the UBM layers are etched followed by stripping off the photoresist layer. A stencil is then aligned on the wafer and solder paste is squeegeed through the stencil to fill the openings on top of the bond pads and the UBM layers. After the stencil is removed, the solder bumps may be reflown into a furnace to form solder balls.

One drawback of the solder paste screen printing process is that, with the recent trend in the miniaturization of device dimensions and the reduction in bump to bump spacing (or pitch), the prior art solder paste screening techniques become impractical. For instance, one of the problems in applying solder paste screening technique to modern IC devices is the paste composition itself. A paste in generally composed of a flux and solder alloy particles. The consistency and uniformity of the solder paste composition becomes more difficult to control with a decreasing solder bump volume. A possible solution for this problem is the utilization of solder paste that contains extremely small and uniform solder particles. However, this can only be achieved at a very high cost penalty. Another problem is using the solder paste screening technique in modern high-density devices is the reduced pitch between bumps. Since there is a large reduction in volume from a paste to the resulting solder bump, the screen holes must be significantly larger in diameter than the final bumps. It is therefore generally desirable to form solder bumps that are reflown into solder balls with a larger height and a larger pitch between the balls.

Several other methods are known to those skilled in the art for producing solder bumps on a semiconductor device. One such method is called the solder jet printing method. The solder jet printer method is based upon piezoelectric demand mode ink jet printing technology and is capable of producing and placing molten solder droplets 25–125 micrometers in diameter at rates of up to 2000 per second. In demand mode ink jet printing systems, a volumetric change in the fluid is induced either by the displacement of piezoelectric material that is coupled to the fluid or by the formation of the vapor bubble in the ink caused by heating a resistive element. The volumetric change causes pressure transience to occur in the fluid, and these are directed so as to produce a drop that issues from an orifice. A droplet is created only when it is desired in demand mode systems. Demand mode ink jet printing produces droplets that are approximately equal to the orifice diameter of the droplet generator.

Another method for producing solder bumps is known as the micro-punching method. In the micro-punching method, solder tape is supplied from a spool and rolled up by a motor driven spool. A micro-punch is driven by an electric actuator and a displacement enlarging mechanism. A micro-punch and die set blanks a thin solder tape and forms a small cylindrical piece. A solder flux may be formed over the entire semiconductor wafer to be bumped and the solder pieces may be punched and placed directly onto the wafer.

FIGS. 1A–E illustrate another prior art method of forming a bump on a substrate such as a semiconductor wafer. As shown in FIG. 1A, a semiconductor wafer 10 is provided having a base silicon substrate 12 with metal interconnect layers overlying the base silicon substrate and an upper passivation blanket 14, which may be one or more layers, that extends partially over a bond pad or contact pad 15 located on the upper surface of the semiconductor wafer. The passivation blanket 14 has an opening overlying the contact pad 15 so that electrical contact to an external circuit may be made from the semiconductor wafer 10. The contact pad 15 may be made from any of a variety of metals, such as aluminum, aluminum alloys, copper, and copper alloys. Typically, an under bump metallurgy (UBM) 16 is provided over the entire upper surface of the semiconductor wafer 10 and over the upper surface of the contact pad 15. The UBM 16 may be composed of a plurality of individual layers of a variety of different metals. As an example, a first layer 18 may be provided over the semiconductor wafer upper surface and upper surface of the contact pad. The first layer 18 may include a thin layer of titanium (for example, 0.1 and micrometers thick). The UBM 16 may include a second layer 20 overlying the first layer 18. The second layer 20 may be composed of any of a variety of metals as well. For example, the second layer may include a layer of copper (e.g., 0.5 micrometers thick). The UBM 16 may be deposited by any of a variety of methods including electroless plating, sputtering, or electroplating. As shown in FIG. 1B, thereafter, a photoresist layer 22 is deposited over the UBM 16 and is patterned to provide an opening 24 overlying the contact pad 15 on the semiconductor wafer 10. The photoresist layer 22 may be a dry film photoresist. Thereafter, a first seed layer 26 may be deposited over the UBM 16. The first seed layer 26 preferably includes copper. A second seed layer 28 may be deposited over the first seed layer 26, and the second seed layer 28 may include nickel. The first and second seed layers 26, 28 may be deposited by any of a variety of methods, but preferably are deposited by electroplating. Thereafter, an electrically conductive material 30 may be deposited on top of the seed layers. Preferably the electrically conductive material 30 includes solder, preferably in a 63 weight percent Sn, 37 weight percent Pb eutectic composition. The electrically conductive material 30 may be deposited by any of the above methods described for solder, but preferably is deposited by screen printing as shown in FIG. 1C. As shown in FIG. 1D, the dry film photoresist 22 is removed by plasma etching, and thereafter the excess UBM 16 is removed by etching to leave a portion of the UBM 16 overlying the contact pad 15, and underlying the seed layers 26, 28 and the electrically conductive material 30. The electrical conductive material 30 is reflown to form a bump 32 on the wafer 10.

However, occasionally the dry film photoresist 22 does not adequately adhere to the features of the semiconductor wafer, particularly the raised portions of the UBM 16 in the area of the sides of the contact pad 15 resulting in a gap 34 as shown in FIG. 2A. Still further, if the seed layers 26, 28 are deposited using electroplating, the dry film photoresist 22 may be attacked by the electroplating solutions resulting in the formation of the gaps 34 (also shown in FIG. 2A). Consequently, when the seed layers 26, 28 are deposited by electroplating, extensions 36 develop that extend under the dry photoresist film near the vertical walls 35 that define the opening 24 overlying the contact pad 15 (as shown in FIG. 2B). That is, the copper and nickel layers 26, 28 permeate underneath the photoresist layer 22. The extensions 36 also extend beyond the sides of the contact pad 15. The photoresist layer 22 is then removed, but the extensions 36 have a downward sloped as shown in FIG. 2C. Consequently, when the electrically conductive material 30 (solder) is reflown by heating, the electrically conductive material does not form a spherical shape, but collapses as shown in FIG. 2D. The present invention overcomes the prior art problems associated with electroplating portions of the electrically conductive structure into the opening formed in a dry film photoresist layer.

SUMMARY OF THE INVENTION

A method of forming a bump on a substrate such as a semiconductor wafer or flip chip. One embodiment of the method includes the step of providing a semiconductor device having a contact pad and having an upper passivation layer and an opening formed in the upper passivation layer exposing a portion of the contact pad. An under bump metallurgy is deposited over the upper passivation layer and the contact pad. A first photoresist layer is deposited in a liquid state so that the first photoresist layer covers the under bump metallurgy. A second photoresist layer is deposited over the first photoresist layer, and wherein the second photoresist layer is a dry film photoresist. The first and second photoresist layers are selectively exposed to ultraviolet light to cure the exposed portions and to leave the unexposed portions uncured. The unexposed portions of the second photoresist layer are removed. Thereafter the unexposed portions of the first photoresist layer are removed. Removal of the unexposed portions of the first and second photoresist layers provides an opening in the photoresist layers down to the under bump metallurgy and aligned with the contact pad. An electrically conductive material is deposited into the opening formed in the photoresist layers and overlying the under bump metallurgy and aligned with the contact pad. Thereafter the remaining portions (exposed and cured) of the second photoresist layer are removed. Then the remaining portions (exposed and cured) of the first photoresist layers are removed. The electrically conductive material is reflown to provide a bump on the semiconductor device.

In another embodiment of the invention the semiconductor device includes a semiconductor wafer.

Another embodiment of the invention further includes a step of depositing at least a first seed layer over the under bump metallurgy prior to depositing the electrically conductive material.

In another embodiment of the invention the first seed layer comprises copper.

Another embodiment of the invention further includes the step of depositing a first seed layer over the under bump metallurgy, and depositing a second seed layer over the first seed layer prior to depositing the electrically conductive material.

In another embodiment of the invention the first seed layer comprises copper and the second seed layer comprises nickel.

In another embodiment of the invention the under bump metallurgy includes a first and second layer.

In another embodiment of the invention the first layer of the under bump metallurgy comprises titanium, and a second layer of the under bump metallurgy comprises copper.

In another embodiment of the invention the step of removing the unexposed portions of the second photoresist layer comprises selectively wet etching the second photoresist layer.

In another embodiment of the invention the step of selective wet etching comprises etching the second photoresist layer to the solution comprising $Na_2CO_3$.

In another embodiment of the invention the step of removing the remaining portions of the first photoresist layer comprises plasma etching the first photoresist layer.

In another embodiment of the invention the step of removing the remaining portions of the second photoresist layer comprises wet etching the photoresist layer with a solution comprising and $Na_2CO_3$.

In another embodiment of the invention the step of removing the remaining portions of the first photoresist layer comprises plasma etching the first photoresist layer.

In another embodiment of the invention the first photoresist layer comprises a negative photoresist.

In another embodiment that the invention the first negative photoresist layer is transparent to ultraviolet light.

In another embodiment of the invention the second photoresist layer comprises a negative photoresist.

Another embodiment of the invention includes a method of making a bump on a semiconductor wafer. A semiconductor wafer is provided having a contact pad and having an upper passivation layer and an opening formed in the passivation layer exposing a portion of the contact pad. An under bump metallurgy is deposited over the upper passivation layer and the contact pad. A first photoresist layer in a liquid state is deposited over the under bump metallurgy. The first photoresist layer is solidified. A second photoresist layer is deposited over the first photoresist layer, and wherein the second photoresist layer comprises a dry film photoresist. Portions of the first and second photoresist layers are selectively exposed to ultraviolet light to cure the exposed portions, and leave uncured those portions of the photoresist layer not exposed to the ultraviolet light. The unexposed portions of the second photoresist layer are removed by etching the second photoresist layer with a solution including $Na_2CO_3$. The unexposed portions of the first photoresist layer are removed by plasma etching. Removal of the unexposed portions of the first and second photoresist layers provides an opening in the photoresist layer down to the under bump metallurgy and aligned with contact pad. A first seed layer including copper is electroplated over the under bump metallurgy. A second seed layer including nickel is electroplated over the first seed layer. Solder is deposited into the opening formed in the photoresist layer and over the second seed layer. The remaining (cured) portion of the second photoresist layer is removed. Thereafter the remaining portion (cured) of the first photoresist layer is removed. The solder is reflown to provide a bump on the semiconductor wafer.

In another embodiment of the invention the solder is deposited in the opening in the photoresist layers by printing.

Another embodiment of the invention includes a method of making a bump on a semiconductor device. A semiconductor device is provided having a contact pad and having an upper passivation layer and an opening formed in the passivation layer exposing a portion of the contact pad. An under bump metallurgy is deposited over the upper passivation layer and the contact pad. A first photoresist in a liquid state is deposited over the under bump metallurgy. The first photoresist layer is solidified so that the first photoresist layer adheres to the under bump metallurgy without any gaps between the first photoresist layer and the under bump metallurgy. A second photoresist layer is deposited over the first photoresist layer, and wherein the second photoresist layer comprises a dry film photoresist. Then portions of the first and second photoresist layers are selectively developed, leaving other portions of the first and second photoresist layers undeveloped. The undeveloped portions of the second photoresist layer are removed. Thereafter, undeveloped portions of the first photoresist layer are removed. The removal of the undeveloped portions of the first and second photoresist layers provides an opening in the photoresist layers down to the under bump metallurgy and aligned with contact pad. An electrically conductive material is deposited into the opening formed in the photoresist layers and overlying the under bump metallurgy and aligned with contact pad. The remaining portions of the second photoresist layer are removed. Thereafter the remaining portions of the first photoresist layer are removed. The electrically conductive material is reflown to provide a bump on a semiconductor device.

These and other objects, features and advantages of the present invention will become apparent from the following brief description of the drawings, detailed description of the preferred embodiments, and appended claims and drawings.

DETAILED DESCRIPTION OF PREFERRED EMBODIMENTS

Figure 1A:
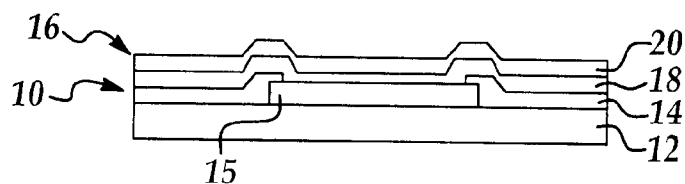
FIG. 1A illustrates the prior art step of depositing an under bump metallurgy on a semiconductor wafer having an upper passivation layer and contact pad.
Figure 1B:
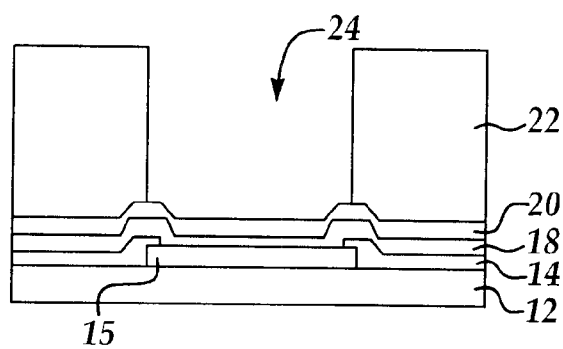
FIG. 1B illustrates the prior art step of depositing a dry film photoresist layer and patterning the photoresist layer to provide an opening over the under bump metallurgy and aligned with the contact pad on the semiconductor wafer.
Figure 1C:
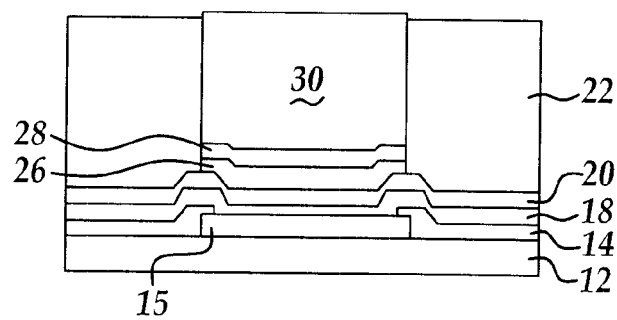
FIG. 1C illustrates the steps of depositing multiple seed layers and solder into the opening formed in the photoresist over the under bump metallurgy and aligned with contact pad.
Figure 1D:
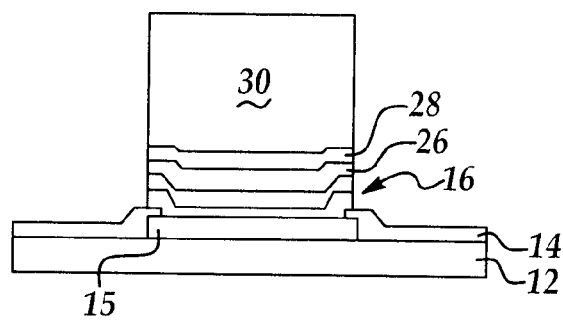
FIG. 1D illustrates the steps of removing the photoresist layer, and removing excess under bump metallurgy leaving a portion of the under bump metallurgy overlying the contact pad, and underlying the solder.
Figure 1E:
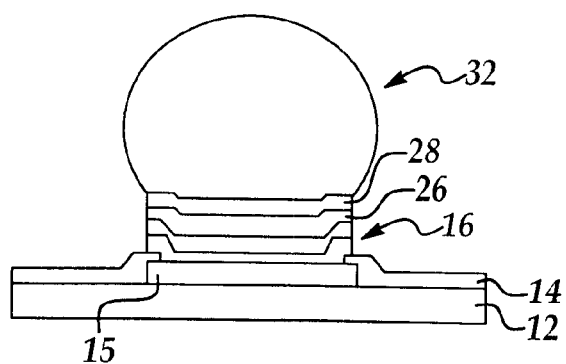
FIG. 1E illustrates the step of reflowing the solder to provide a ball or bump on the semiconductor wafer.
Figure 2A:
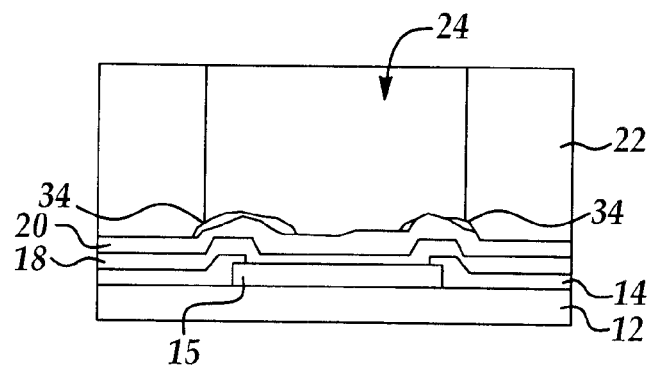
FIG. 2A illustrates the prior art step of depositing a dry film photoresist and patterning the photoresist to provide an opening down to the under bump metallurgy and aligned with the contact pad, and wherein the photoresist layer does not properly adhere to the under bump metallurgy resulting in gaps between the photoresist and under bump metallurgy.
Figure 2B:
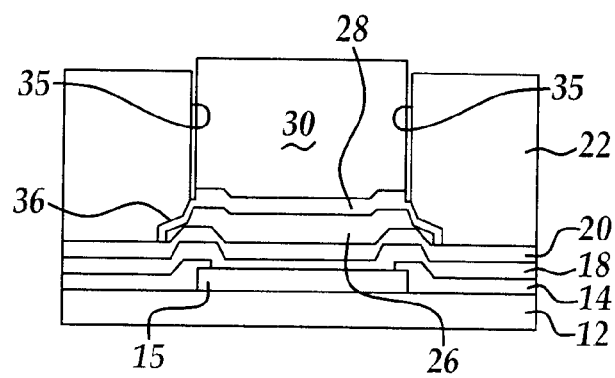
FIG. 2B illustrates the prior art step of depositing seed layers into the opening in the photoresist layer and over the under bump metallurgy, and wherein the seed layers develop extensions as a result of the gaps between the photoresist layer and the under bump metallurgy.
Figure 2C:
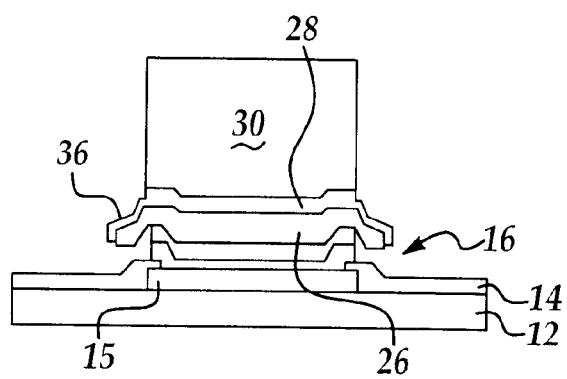
FIG. 2C illustrates the prior art step of removing the photoresist layer and a portion of the under bump metallurgy.
Figure 2D:
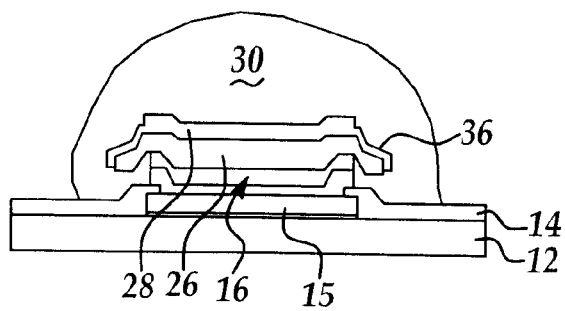
FIG. 2D illustrates the prior art step of reflowing the solder and wherein the solder collapses forming an irregular shaped bump on the semiconductor wafer.

FIGS. 3 A–K illustrate a method of forming a bump on a substrate using multiple photoresist layers according to the present invention. As shown in FIG. 3A, a semiconductor wafer 10 is provided having a base semiconductor substrate (with metal interconnect layers thereon) 12 and an upper passivation blanket 14 overlying portions of a contact pad 15 on the semiconductor wafer 10. The contact pad 15 may be comprised of any of a variety of metals, such as aluminum, aluminum alloys, copper and copper alloys. An under bump metallurgy (UBM) 16 is provided over the entire surface of the semiconductor wafer 10 including over the passivation blanket 14 and the contact pad 15. The UBM 16 may be deposited by any of a variety of methods, such as electroless plating, electroplating, but preferably is deposited by sputtering. The UBM may include any of a variety of layers of metals, but for a copper based contact pad 15, the UBM preferably includes a first layer 18 which comprises titanium in a thickness of about 0.1 microns. A second layer 20 of the under bump metallurgy overlies the first layer 18, and the second layer 20 preferably comprises copper deposited in a thickness of about 0.5 microns. As shown in FIG. 3B, a first photoresist layer 38 is deposited over the under bump metallurgy 16. Preferably the first photoresist layer 38 is deposited in a liquid state and spun to cover the entire surface of the semiconductor wafer 10. Preferably the first photoresist layer 38 is transparent and is a negative photoresist. Being transparent, the first photoresist layer does not absorb light and therefore does not present any focusing problems. The first photoresist layer is solidified preferably by a soft bake step at about 90–100° C. Thereafter a second photoresist layer 22 is deposited over the first photoresist layer 38 (FIG. 3C). Preferably the second photoresist layer 22 is a dry film photoresist that is deposited over the semiconductor wafer 10 in a sheet form and heated to adhere the film to the surface of the semiconductor wafer (or in this case to the surface of the first photoresist layer 38). Preferably the second photoresist layer 22 is at least 100 microns thick.

Figure 3A:
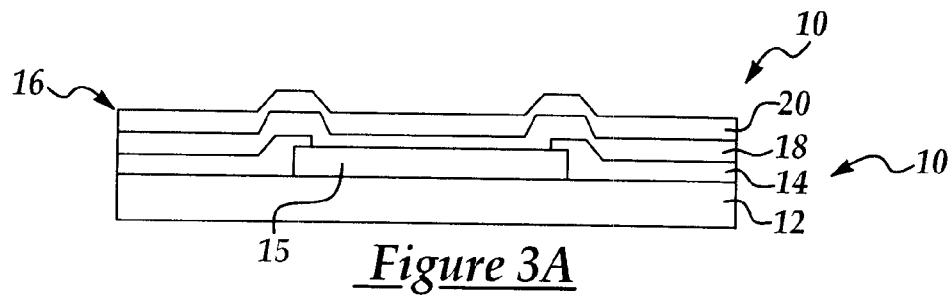
FIG. 3A illustrates the step of providing an under bump metallurgy over a semiconductor wafer having an upper passivation layer and a contact pad according to the present invention.
Figure 3B:
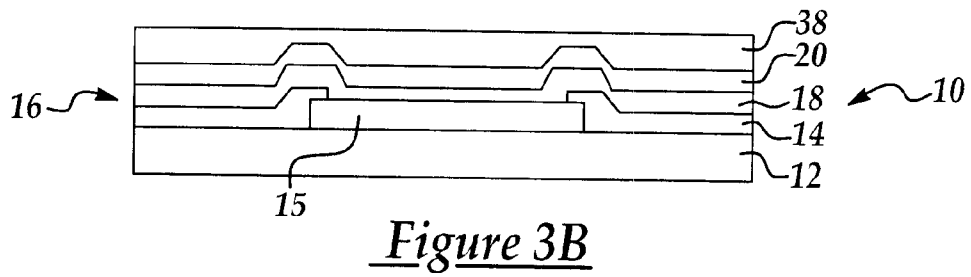
FIG. 3B illustrates the step of depositing a first photoresist layer in a liquid state over the under bump metallurgy according to the present invention.
Figure 3C:
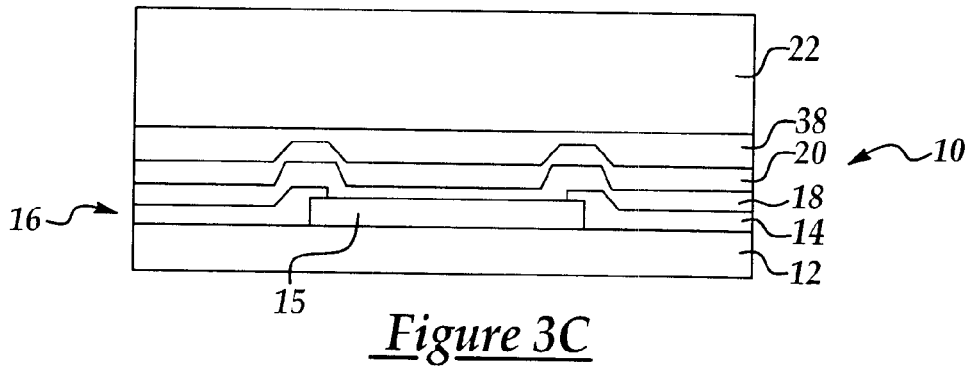
FIG. 3C illustrates the step of depositing a dry film photoresist over the first photoresist layer according to the present invention.
Figure 3D:
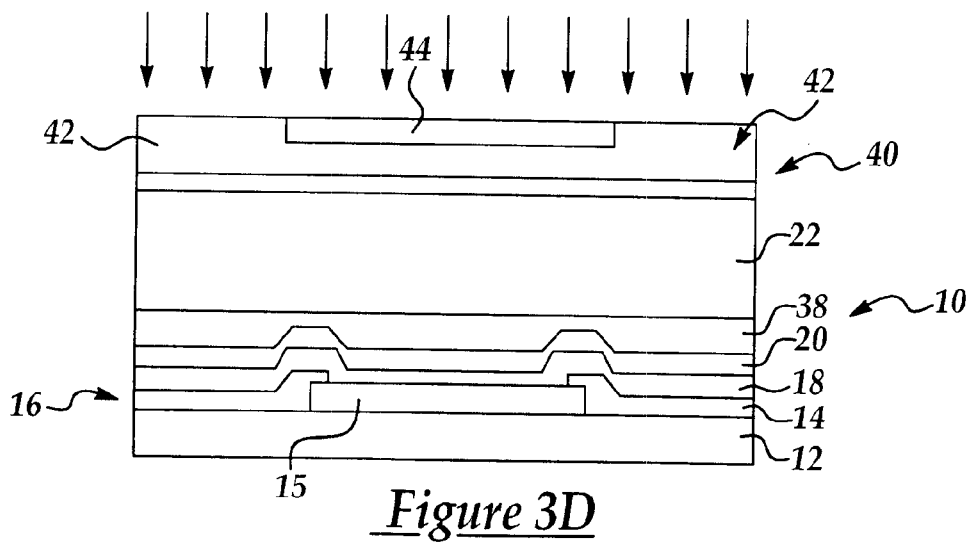
FIG. 3D illustrates the step of selectively exposing the dry film photoresist layer and the first photoresist layer to ultraviolet light according to the present invention.

A mask 40 is provided overlying the photoresist layers 22 and 38. The mask 40 includes clear portions 42 and blackened or opaque portions 48 that do not allow light to be transmitted therethrough. An ultraviolet light is shown through the mask to selectively exposed portions of the photoresist layers 22, 38 thereby cross-linking polymers in the exposed portions of the photoresist layers (FIG. 3D).

Figure 3E:
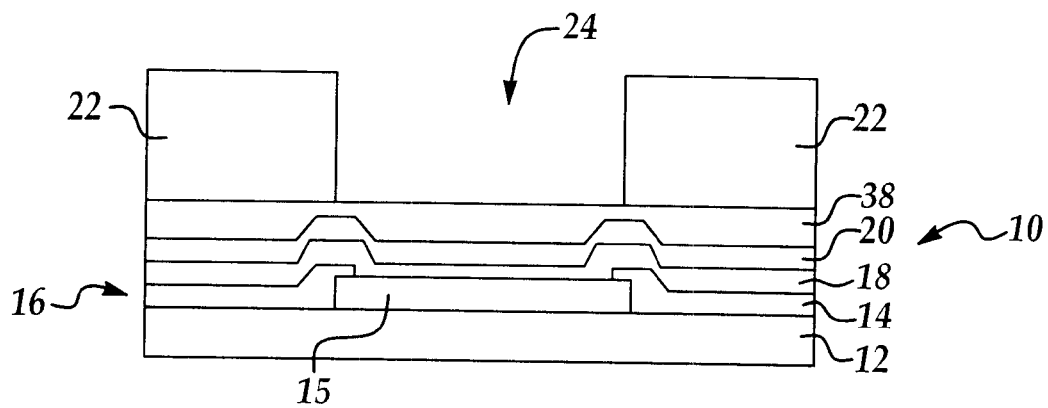
FIG. 3E illustrates the step of removing the undeveloped portions of the dry film photoresist according to the present invention.
Figure 3F:
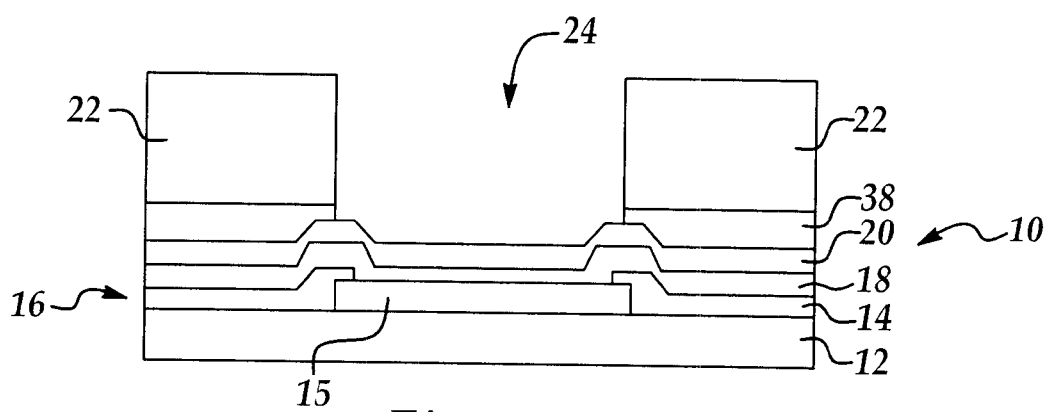
FIG. 3F illustrates the step of removing the undeveloped portions of the first photoresist layer to provide an opening in the photoresist layer down to the under bump metallurgy overlying the contact pad of the semiconductor wafer according to the present invention.
Figure 3G:
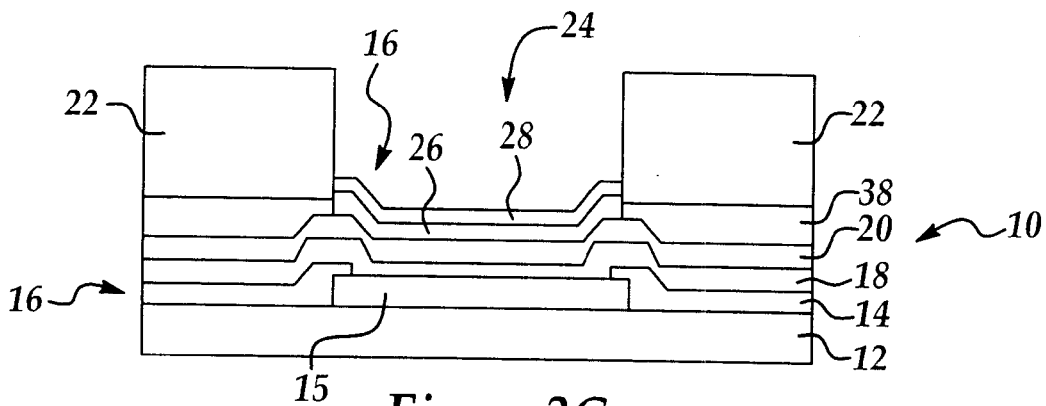
FIG. 3G illustrates the step of depositing seed layers into the opening in the photoresist and overlying the under bump metallurgy and aligned with the contact pad according to the present invention.
Figure 3H:
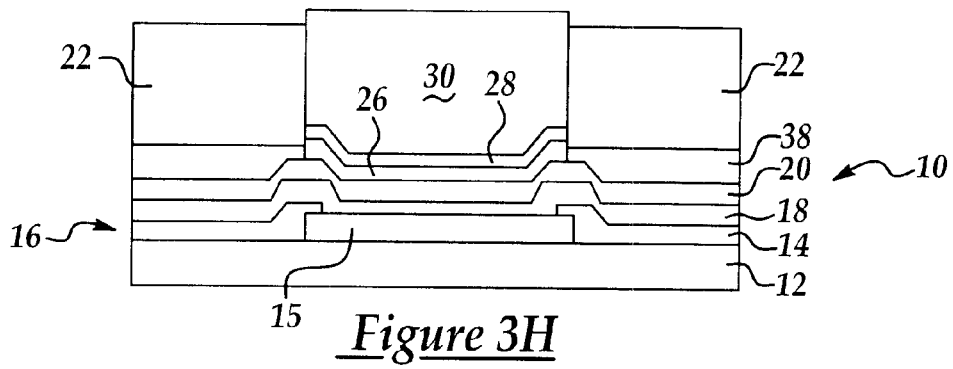
FIG. 3H illustrates the step of depositing an electrically conductive material into the opening in the photoresist layers and over the seed layers according to the present invention.
Figure 3I:
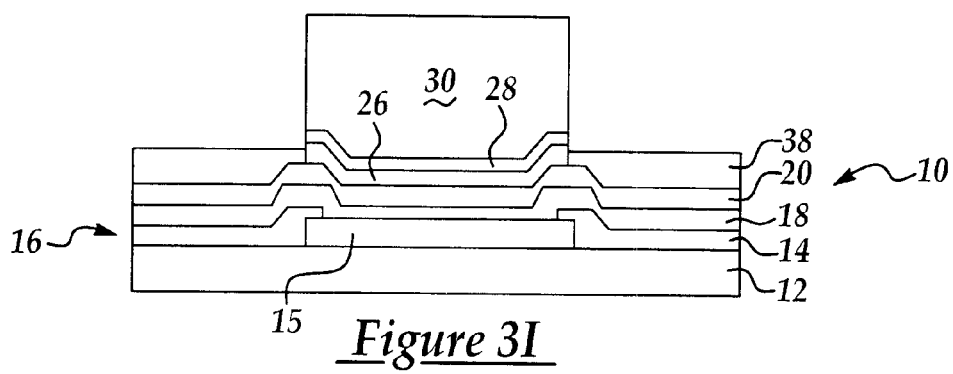
FIG. 3I illustrates the step of removing the dry film photoresist layer according to the present invention.
Figure 3J:
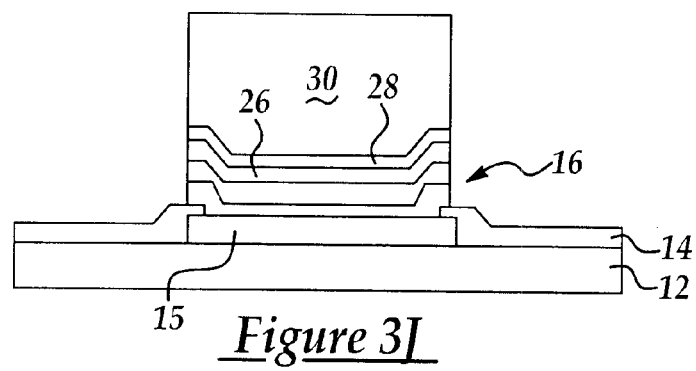
FIG. 3J illustrates the step of removing the first photoresist layer according to the present invention.
Figure 3K:
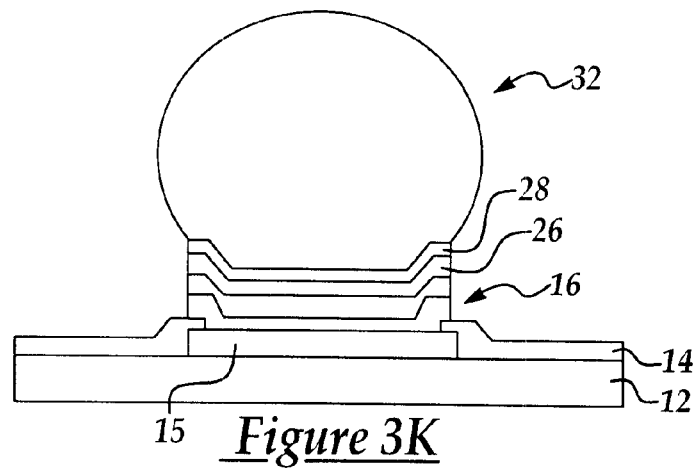
FIG. 3K illustrates the step of reflowing the electrically conductive material to provide a ball or bump on the semiconductor wafer according to the present invention.

Thereafter, as shown in FIG. 3E, the unexposed (or undeveloped) portions of the second photoresist layer 22 (dry film photoresist layer) are removed. Preferably the unexposed portions of the second photoresist layer are removed by wet etching solution which preferably is a one percent solution of $Na_2CO_3$. Thereafter, the unexposed (or undeveloped) portions of the first photoresist layer 38 are removed by any of a variety of methods including plasma etching to provide an opening 24 through the photoresist layers 22 and 38 down to the UBM 16 overlying the contact pad 15 as shown in FIG. 3F. Thereafter, first and second seed layers 26, 28 are deposited over the under bump metallurgy 16 as shown in FIG. 3G. Preferably, the first and second seed layers 26, 28 are deposited by electroplating. The first seed layer 26 preferably is a layer comprising copper in a thickness of about five microns. Preferably the second seed layer 28 comprises nickel in a thickness of about three microns. As shown in FIG. 3H, thereafter an electrically conductive material 30 is deposited into the opening 24 in the photoresist layers 22 and 38 and over the seed layers 26, 28. The electrically conductive material 30 may be any of a variety of metals, metal alloys or metals and mixtures of other materials, but preferably is a solder. The solder may be any of a variety of compositions but preferably includes a 63 weight percent Sn and 37 weight percent Pb eutectic composition. Thereafter, the remaining (exposed or developed) portions of the first photoresist layer 22 are removed by any of a variety of methods, but preferably by wet etching using a $H_2SO_4$ solution (FIG. 3I). The first photoresist layer 38 is removed to by any variety of methods including plasma etching as shown in FIG. 3J. Finally, the electrically conductive material 30 (solder) is reflown by heating to form a ball or bump 32 on the semiconductor wafer 10 (FIG. 3K).

What is claimed is:

1. A method of making a bump on a semiconductor device comprising:

providing a semiconductor device having a contact pad and having an upper passivation layer and an opening formed in the passivation layer exposing a portion of the contact pad;

depositing an under bump metallurgy over the upper passivation layer and the contact pad;

depositing a first photoresist layer in a liquid state over the under bump metallurgy, said first photoresist layer is transparent to ultraviolet light;

depositing a second photoresist layer over the first photoresist layer, and wherein the second photoresist layer comprises a dry film photoresist;

selectively exposing portions of the first and second photoresist layers to ultraviolet light to cure the exposed portions and leaving uncured those portions of the photoresist layers that were unexposed to the light;

removing the unexposed portions of the second photoresist layer;

removing the unexposed portions of the first photoresist layer, and wherein the removal of the unexposed portions of the first and second photoresist layers provides an opening in the photoresist layers down to the under bump metallurgy and aligned with the contact pad;

depositing an electrically conductive material into the opening formed in the photoresist layers and overlying the under bump metallurgy and aligned with the contact pad;

removing the remaining portions of the second photoresist layer;

removing the remaining portions of the first photoresist layer; and reflowing the electrically conductive material to provide a bump on the semiconductor device.

2. A method as set forth in claim 1 wherein the semiconductor device comprises a semiconductor wafer.

3. A method as set forth in claim 1 further comprising the step of depositing at least a first seed layer over the under bump metallurgy prior to depositing the electrically conductive material.

4. A method as set forth in claim 3 wherein the first seed layer comprises copper.

5. A method as set forth in claim 1 further comprising the steps of depositing a first seed layer over the under bump metallurgy, and depositing a second seed layer over the first seed layer prior to depositing the electrically conductive material.

6. A method as set forth in claim as set forth in claim 5 wherein the first seed layer comprises copper, and wherein the second seed layer comprises nickel.

7. A method as set forth in claim 1 wherein the under bump metallurgy comprises a first and second layer.

8. A method as set forth in claim 7 wherein the first layer of the under bump metallurgy comprises titanium, and wherein the second layer of the under bump metallurgy comprises copper.

9. A method as set forth in claim 1 wherein the step of removing the unexposed portions of the second photoresist layer comprises wet etching the second photoresist layer.

10. A method as set forth in claim 9 wherein the step of wet etching comprises etching the second photoresist layer to a solution comprising $Na_2CO_3$.

11. A method as set forth in claim 1 wherein the step of removing the remaining portions of the first photoresist layer comprises plasma etching the first photoresist layer.

12. A method as set forth in claim 1 wherein the step of removing the remaining portions of the second photoresist layer comprises wet etching the second photoresist layer in a solution comprising $H_2SO_4$.

13. A method as set forth in claim 1 further comprising the step of solidifying the first photoresist layer prior to depositing the second photoresist layer.

14. A method of making a bump on a semiconductor device comprising:

providing a semiconductor device having a contact pad and having an upper passivation layer and an opening formed in the passivation layer exposing a portion of the contact pad;

depositing an under bump metallurgy over the upper passivation layer and the contact pad;

depositing a first photoresist layer in a liquid state over the under bump metallurgy;

solidifying the first photoresist layer so that the first photoresist layer adheres to the under bump metallurgy without any gaps between the first photoresist layer and the under bump metallurgy;

depositing a second photoresist layer over the first photoresist layer, and wherein the second photoresist layer comprises a dry film photoresist;

selectively developing a portion of the first and second photoresist layers leaving other portions of the first and second photoresist layers undeveloped;

removing the undeveloped portions of the second photoresist layer;

removing the undeveloped portions of the first photoresist layer, wherein the removal of the undeveloped portions of the first and second photoresist layers provides an opening in the photoresist layers down to the under bump metallurgy aligned with the contact pad;

depositing an electrically conductive material into the opening formed in the photoresist layers and overlying the under bump metallurgy and aligned with the contact pad;

removing the developed portions of the second photoresist layer;

removing the developed portions of the first photoresist layer; and reflowing the electrically conductive material to provide a bump on the semiconductor device.

15. A method as set forth in claim 14 wherein the first photoresist layer comprises a negative photoresist.

16. A method as set forth in claim 14 wherein the second photoresist layer comprises a negative photoresist.

* * * * *